(12) United States Patent
Fan et al.

(10) Patent No.: US 10,802,409 B2
(45) Date of Patent: Oct. 13, 2020

(54) METROLOGY METHOD AND APPARATUS, SUBSTRATE, LITHOGRAPHIC METHOD AND ASSOCIATED COMPUTER PRODUCT

(71) Applicant: ASML NETHERLANDS B.V., Veldhoven (NL)

(72) Inventors: Chi-Hsiang Fan, San Jose, CA (US); Maurits Van Der Schaar, Eindhoven (NL); Youping Zhang, Dublin, CA (US)

(73) Assignee: ASML Netherlands B.V., Veldhoven (NL)

( * ) Notice: Subject to any disclaimer, the term of this patent is extended or adjusted under 35 U.S.C. 154(b) by 260 days.

(21) Appl. No.: 15/962,826

(22) Filed: Apr. 25, 2018

(65) Prior Publication Data
US 2018/0238737 A1    Aug. 23, 2018

Related U.S. Application Data

(60) Provisional application No. 62/491,857, filed on Apr. 28, 2017.

(51) Int. Cl.
*G03F 7/20* (2006.01)

(52) U.S. Cl.
CPC ...... *G03F 7/70633* (2013.01); *G03F 7/70616* (2013.01); *G03F 7/70683* (2013.01)

(58) Field of Classification Search
CPC ............. G03F 7/70616; G03F 7/70633; G03F 7/70683
USPC .................................................... 430/22, 30
See application file for complete search history.

(56) References Cited

U.S. PATENT DOCUMENTS

| | | | |
|---|---|---|---|
| 7,791,732 B2 | 9/2010 | Den Boef et al. |
| 8,411,287 B2 | 4/2013 | Smilde et al. |
| 8,867,020 B2 | 10/2014 | Smilde et al. |
| 9,081,303 B2 | 7/2015 | Cramer et al. |
| 9,910,366 B2 | 3/2018 | Middlebrooks et al. |
| 2002/0135781 A1 | 9/2002 | Singh et al. |
| 2004/0233440 A1 | 11/2004 | Mieher et al. |
| 2006/0066855 A1 | 3/2006 | Den Boef et al. |
| 2009/0296075 A1 | 12/2009 | Hu et al. |
| 2011/0027704 A1 | 2/2011 | Cramer et al. |
| 2011/0043791 A1 | 2/2011 | Smilde et al. |
| 2011/0080585 A1 | 4/2011 | Rabello et al. |
| 2012/0162647 A1 | 6/2012 | Li |
| 2012/0242970 A1 | 9/2012 | Smilde et al. |
| 2016/0061589 A1 | 3/2016 | Bhattacharyya et al. |
| 2016/0161864 A1 | 6/2016 | Middlebrooks et al. |
| 2016/0266505 A1 | 9/2016 | Amit et al. |
| 2016/0300767 A1 | 10/2016 | Ko et al. |
| 2018/0017881 A1 | 1/2018 | Van Der Schaar et al. |

FOREIGN PATENT DOCUMENTS

| | | |
|---|---|---|
| WO | 2009/078708 | 6/2009 |
| WO | 2009/106279 | 9/2009 |

OTHER PUBLICATIONS

Taiwanese Office Action issued in corresponding Taiwanese Patent Application No. 107114190, dated Jan. 9, 2019.

*Primary Examiner* — Christopher G Young
(74) *Attorney, Agent, or Firm* — Pillsbury Winthrop Shaw Pittman LLP

(57) ABSTRACT

A method of measuring n values of a parameter of interest (e.g., overlay) relating to a structure forming process, where n>1. The method includes performing n measurements on each of n+1 targets, each measurement performed with measurement radiation having a different wavelength and/or polarization combination and determining the n values for a parameter of interest from the n measurements of n+1 targets, each of the n values relating to the parameter of interest for a different pair of the layers. Each target includes n+1 layers, each layer including a periodic structure, the targets including at least n biased targets having at least one biased periodic structure formed with a positional bias relative to the other layers, the biased periodic structure being in at least a different one of the layers per biased target. Also disclosed is a substrate having such a target and a patterning device for forming such a target.

22 Claims, 3 Drawing Sheets

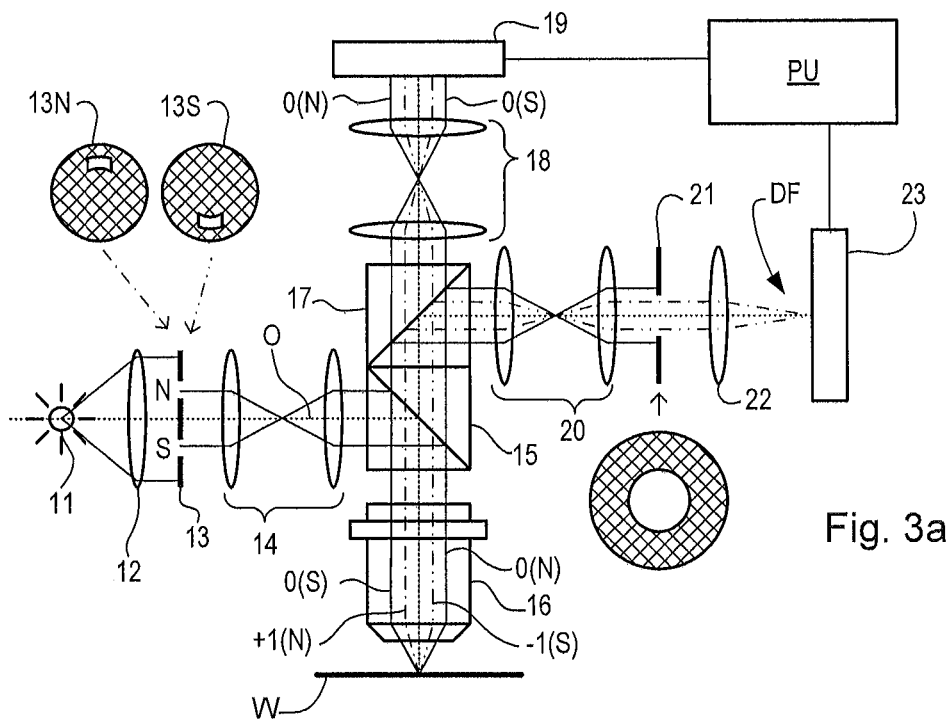
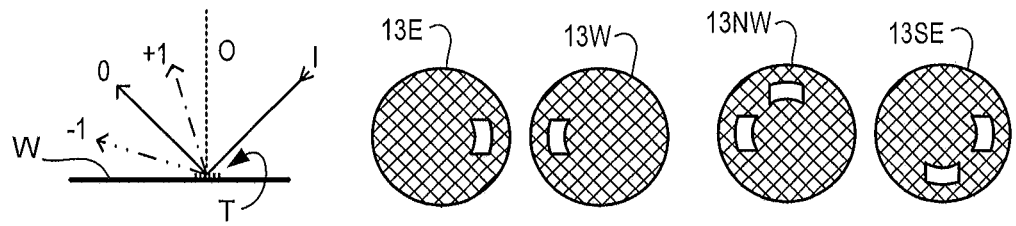
Fig. 3b  Fig. 3c  Fig. 3d
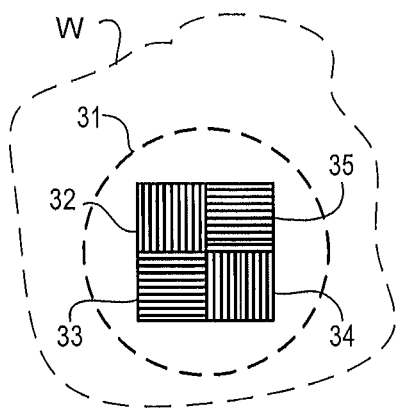
Fig. 4
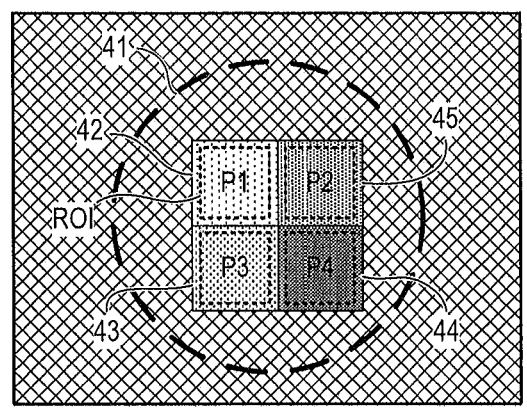
Fig. 5

METROLOGY METHOD AND APPARATUS, SUBSTRATE, LITHOGRAPHIC METHOD AND ASSOCIATED COMPUTER PRODUCT

This application claims the benefit of priority of U.S. Provisional Patent Application No. 62/491,857, which was filed on Apr. 28, 2017. The content of the foregoing application is incorporated herein in its entirety by reference.

FIELD

The present description relates to a method, apparatus, and computer product for metrology usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). For example, this simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279 which documents are hereby incorporated by reference in their entireties. Further developments of the technique have been described in U.S. patent application publication nos. US 2011-0027704, US 2011-0043791 and US 20120-0242970. The contents of all these applications are also incorporated herein in their entireties by reference. Diffraction-based overlay using dark-field detection of the diffraction orders enables overlay measurements on smaller targets. These targets can be smaller than the illumination spot and may be surrounded by product structures on a substrate. Targets can comprise multiple gratings which can be measured in one image.

In a known metrology technique, overlay measurement results are obtained by measuring an overlay target twice under certain conditions, while either rotating the overlay target or changing the illumination mode or imaging mode to obtain separately the −1st and the +1st diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay (unintentional positional offset between layers).

SUMMARY

A separate overlay target is required for each measurement of a layer pair (or overlay pair), that is for each pair of layers within a later stack. It would be desirable to measure multiple overlay pairs in a more efficient manner.

In an aspect, there is provided a method of measuring n values of a parameter of interest relating to a process for forming one or more structures on a substrate, where n>1, the method comprising: performing n measurements on each of n+1 targets, each measurement being performed with measurement radiation comprising a different wavelength and/or polarization combination; each target comprising n+1 layers, each layer comprising a periodic structure, the targets comprising at least n biased targets having at least one biased periodic structure formed with an intentional positional bias relative to the other layers, the biased periodic structure being in at least a different one of the layers per biased target; and determining the n values for the parameter of interest from the n measurement of n+1 targets, each of the n values relating to the parameter of interest for a different pair of the layers.

In an aspect, there is provided a substrate comprising n+1 targets, each target comprising n+1 layers, each layer comprising a periodic structure, the targets comprising at least n biased targets having at least one biased periodic structure formed with a positional bias relative to the other layers, the biased periodic structure being in at least a different one of the layers per biased target.

In an aspect, there is provided a computer program and associated computer program carrier for performing a method as described herein.

Other aspects include a metrology device operable to perform a method as described herein, a lithographic apparatus being operable to manufacture a substrate as described herein, by being operable to form the targets on the substrate using a lithographic process; and a set of patterning devices, each having a pattern for patterning a beam of radiation to form a structure on a substrate in a lithographic process, and operable to produce a substrate as described herein, each patterning device comprising a pattern for forming a different layer of the targets.

BRIEF DESCRIPTION OF THE DRAWINGS

Embodiments of the invention will now be described, by way of example only, with reference to the accompanying drawings in which.

FIG. 3A is schematic diagram of a measurement apparatus for use in measuring targets according to embodiments of the invention using a first pair of illumination apertures providing certain illumination modes;

FIG. 3B is a schematic detail of a diffraction spectrum of a target for a given direction of illumination;

FIG. 3C is a schematic illustration of a second pair of illumination apertures providing further illumination modes in using a measurement apparatus for diffraction based overlay measurements;

FIG. 3D is a schematic illustration of a third pair of illumination apertures combining the first and second pairs of apertures providing further illumination modes in using a measurement apparatus for diffraction based overlay measurements;

FIG. 4 depicts a form of multiple periodic structure (e.g., multiple grating) target and an outline of a measurement spot on a substrate;

FIG. 5 depicts an image of the target of FIG. 4 obtained in the apparatus of FIG. 3;

DETAILED DESCRIPTION

Before describing embodiments in detail, it is instructive to present an example environment in which embodiments may be implemented.

Figure 1:
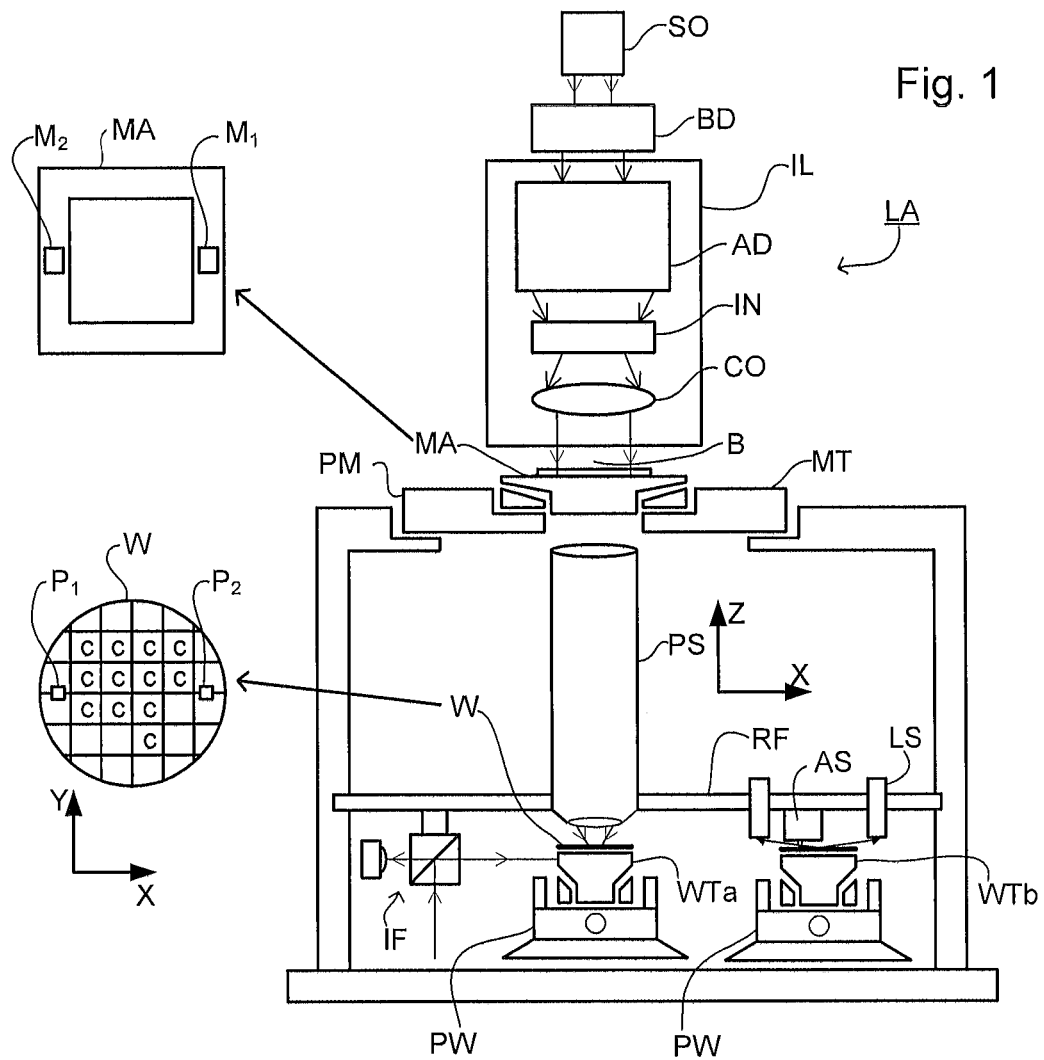
FIG. 1 depicts an lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
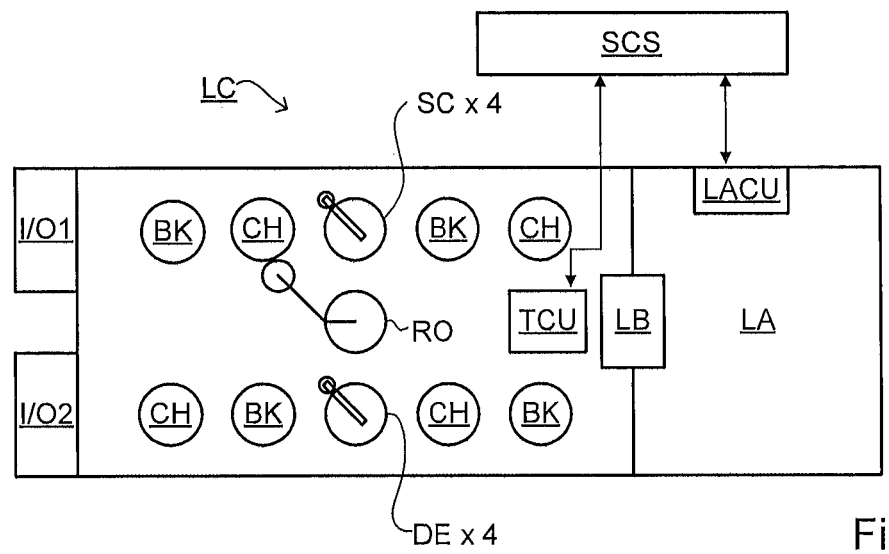
FIG. 2 depicts a lithographic cell or cluster according to an embodiment of the invention.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay (DBO or μDBO) using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. In an embodiment, the pattern of the grating is sensitive to optical aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

A (dark field) metrology apparatus suitable for use in embodiments of the invention is shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and +1 orders diffracted by the target on substrate W are collected by objective lens 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the $-1^{st}$ and the $+1^{st}$ diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and (d). FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

FIG. 4 depicts an example of a composite metrology target formed on a substrate. The composite target comprises four periodic structures (in this case, gratings) or sub-targets 32, 33, 34, 35 positioned closely together. The periodic structures may be positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm.

Further, all the periodic structures are used to measure overlay between a particular pair of layers. To facilitate a target being able to measure more than a single pair of layers, periodic structures 32, 33, 34, 35 may be "biased periodic structures" or "biased sub-targets" each having a different positional bias (an intentional positional offset between the periodic structures in different layers) in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different positional bias facilitates distinguishing between the layer pairs. Periodic structures 32, 33, 34, 35 may also differ in their orientation, as shown, so as to diffract incoming radiation in X and Y directions. In one example, periodic structures 32 and 34 are X-direction periodic structures with positional biases of +d, −d, respectively. Periodic structures 33 and 35 may be Y-direction periodic structures with positional biases +d and −d respectively. Separate images of these periodic structures can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter. A particular measurement of the target is to obtain a value for intensity asymmetry. This is done by the image processor and controller PU comparing, for each periodic structure 32-35, the intensity values of an image obtained from only +1 diffraction order and another image from only −1 diffraction order, to identify any difference in their intensity, i.e., an asymmetry. The term "difference" is not intended to refer only to subtraction. Differences may be calculated in ratio form. Also other corresponding higher orders (e.g., +2 and −2 etc.) may be used.

In equation terms, the relationship between overlay OV (overlay between a pair of layers) and intensity asymmetry A is assumed to be:

$$A_{\pm d} = K \sin(OV \pm d)$$

where overlay OV is expressed on a scale such that the target pitch P corresponds to an angle $2\pi$ radians. The term d is the positional bias of the target (or sub-target) being measured. Assuming the OV±d to be small, this can be approximated as a direct proportional relationship between intensity asymmetry A and the total offset OV±d, with K as the proportionality constant (or overlay constant). Therefore, using two measurements of targets with different, known positional biases such as shown in FIG. 4 (e.g. +d and −d), the overlay OV can be calculated.

It is sometimes required to include (e.g., periodic) dummy structures in layers on the substrate for reasons of process uniformity. These dummy structures may be aligned with the target (e.g., below, above or in between the gratings of the target being measured), and where this is so, can influence overlay measurement of the target resulting in an overlay error. This is particularly the case where the dummy structures are aligned with the target and extend parallel to the direction of overlay being measured.

It is therefore proposed in an embodiment, to replace the dummy structure with an additional grating, and measuring the overlay between at least one of the target gratings and the additional grating. This has a further advantage of enabling overlay between two overlay pairs (two layer-pair combinations) to be measured, without requiring a full target (such as that illustrated in FIG. 4) to be formed on the substrate for each overlay pair. Each additional target requires space ("real estate") on the patterning device/substrate, which is limited and minimizing the space required for overlay targets is desirable. As such, in another embodiment, a target design and measurement method is proposed which enables measurement of two or more overlay pairs in a space efficient manner. This method may be used even when no dummy structures were specified.

Figure 6A:
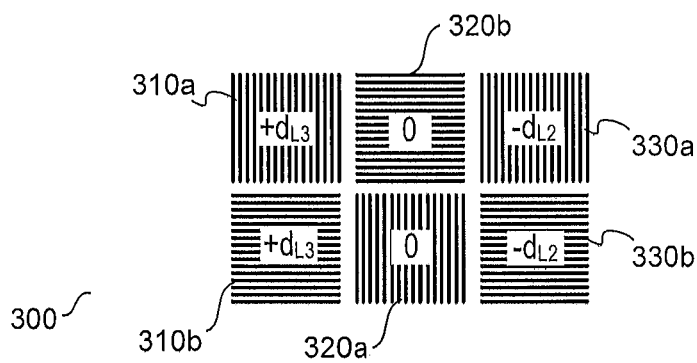
FIG. 6A depicts a top view of a multiple periodic structure according to an embodiment of the invention.
Figure 6B:
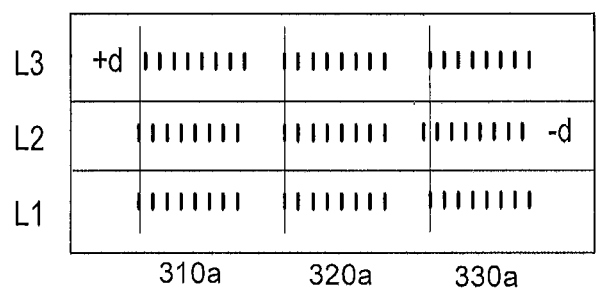
FIG. 6B depicts a cross-sectional view of the multiple periodic structure of FIG. 6A according to an embodiment of the invention.

A proposed target design in accordance to an embodiment is illustrated in FIG. 6. The target design may comprise a plurality of targets. In the particular example shown and throughout the rest of the description, each target is referred to as sub-target forming part of a (composite) target. However, the (sub-)targets may be formed individually and positioned separately from each other. FIG. 6A shows a composite target 300 from above and FIG. 6B shows three of the sub-targets in vertical cross section. FIG. 6A shows the target 300 comprising six sub-targets, three in each of two orthogonal orientations, each sub-target being comprised of a periodic structure or grating in each of three layers, e.g. layers L1, L2 and L3 shown in FIG. 6B. FIG. 6B shows only three of these sub-targets (for clarity), these being sub-targets in only a single orientation (e.g., the Y direction). Considering the sub-targets of a first orientation, there is a first sub-target 310a for which its grating in layer L3 is offset by positional bias +d relative to its gratings in layers L1 and L2, a second sub-target 320a, having no positional bias between any of its gratings in each layer, and a third sub-target 330a for which its grating in layer L2 is offset by positional bias −d relative to its gratings in layers L1 and L3. Optionally, as shown, there may be corresponding sub-targets 310b, 320b, 330b in a second orientation (e.g., the X direction).

It should be noted that the actual form of the target 300 is purely exemplary, and the order/arrangements of the sub-targets, the number of target orientations, and the positional biases may differ from those illustrated. Of relevance is that there are at least three sub-targets for a two overlay pair example, more generally n+1 targets for n overlay pairs, each sub-target having periodic structures in each of its layers; the n+1 sub-targets comprising at least n biased sub-targets having a biased grating in a different one of the target layers, per sub-target.

In an embodiment, it is assumed that the measured intensity asymmetry A is a linear combination of shifts of the three overlay pairs, for each of the sub-targets. According to this assumption, then:

$$A = K_{31}*X_{31} + K_{21}*X_{21} + K_{32}*X_{32}$$

where X is the offset between layers, K is the proportionality constant between the measured intensity asymmetry and offset and the subscript identifies the relevant overlay pair (e.g., $X_{31}$ is the offset between gratings in layer L3 and layer L1). In each case, the offset X will be the sum of overlay OV and, where present, a positional bias (e.g., bias +d or −d).

It should be appreciated that the above linear approximation between intensity asymmetry and overlay is not essential. Intensity asymmetry may be (more correctly) recited as a sum of sine terms, e.g.:

$$A = K_{31} * \text{Sin } X_{31} + K_{21} * \text{Sin } X_{21} + K_{32} * \text{Sin } X_{32}$$

However, as described, in each case the offset X will be sufficiently small for the approximation Sin X≈X to be valid. This simplifies further calculation, such that overlay may be calculated via a matrix inversion as described below. In alternative embodiments which do not use this linear approximation, the overlay will not be determined via a matrix inversion but via a suitable nonlinear optimization.

Since:

$$X_{21} = X_{31} - X_{32}$$

then:

$$\begin{aligned} A &= K_{31} * X_{31} + K_{32} * X_{32} + K_{21} * (X_{31} - X_{32}) \\ &= (K_{31} + K_{21}) * X_{31} + (K_{32} - K_{21}) * X_{32} \\ &= \alpha * X_{31} + \beta * X_{32}, \end{aligned}$$

where $\alpha = K_{31} + K_{21}$ and $\beta = K_3 - K_{21}$.

The intensity asymmetry $A_{310}$, $A_{320}$, $A_{330}$ for sub-gratings 310a/310b, 320a/320b, 330a/330b respectively is:

$$A_{310} = \alpha*(OV_{31}+d) + \beta*(OV_{32}+d)$$

$$A_{320} = \alpha*OV_{31} + \beta*OV_{32}$$

$$A_{330} = \alpha*OV_{31} + \beta*(OV_{32}-d)$$

where d is the magnitude of the positional bias (an intentional offset) between grating pairs described in the subscript and OV is the overlay (an unintentional offset) between the grating pairs described in the subscript. Rearranging gives:

$$\alpha = \frac{A_{310} + A_{330} - 2A_{320}}{d}$$

$$\beta = \frac{A_{320} - A_{330}}{d}$$

Assuming at least second intensity asymmetry measurements $A'_{310}$, $A'_{320}$, $A_{330}'$ are made on the same target using measurement radiation having a different wavelength and/or polarization, then $\alpha'$ and $\beta'$ can also be calculated:

$$\alpha' = \frac{A'_{310} + A'_{330} - 2A'_{320}}{d}$$

$$\beta' = \frac{A'_{320} - A'_{330}}{d}$$

Combining these equations for $\alpha$, $\beta$, $\alpha'$ and $\beta'$, the two overlay pairs $OV_{31}$, $OV_{32}$ can be calculated:

$$\begin{bmatrix} OV_{31} \\ OV_{32} \end{bmatrix} = \begin{bmatrix} \alpha & \beta \\ \alpha' & \beta' \end{bmatrix}^{-1} \begin{bmatrix} A_{320} \\ A'_{320} \end{bmatrix}$$

Of course, with $OV_{31}$, $OV_{32}$ determined, it is simple to calculate the third overlay pair $OV_{21}$, since $X_{21} = X_{31} - X_{32}$.

As already mentioned, the actual form of the target, the location of the biased grating and/or the value of the positional biases may vary. The positional biases are not, for example, required to be of the same magnitude for each sub-target although this simplifies calculations, nor do they need to be in the opposite direction. By way of a specific alternative for a two overlay pair (three sub-targets per orientation) example, one of the biased sub-targets may have biased gratings in both layer L2 and L3, with the other having a biased grating in layer L2. Alternatively, or in addition, it is not necessary for one of the n+1 sub-targets to be a non-biased sub-target. Instead, for n overlay pairs, the target may comprise n+1 biased sub-targets (per direction). However, where a linear approximation is used, the target should be such that the matrix to be inverted in the next paragraph is not a singular matrix. As such, many different other permutations and combinations are possible for the sub-targets compared to that illustrated in FIG. 6.

While this concept has been described for measuring two overlay pairs, it can be extended to any number n of overlay pairs (n>1). In such an embodiment, the number of overlay pairs n is measured on a target comprising n+1 sub-targets (per orientation) and measured using n different wavelengths and/or polarizations. The n+1 sub-targets of the measured target may comprise n biased sub-targets, each having a positional bias (e.g., +d or −d) grating in a different layer. In an embodiment, the other sub-target may comprise no positional bias. For example, each of the n biased sub-targets may comprise sub-targets each having a biased grating in a different one of its upper layers (the layers other than the bottommost layer). In such an example, overlay can be calculated by:

$$\begin{bmatrix} OV_{(n+1)1} \\ OV_{(n+1)2} \\ \vdots \\ OV_{(n+1)n} \end{bmatrix} = \begin{bmatrix} \alpha^1 & \beta^1 & \gamma^1 & \dots \\ \alpha^2 & \beta^2 & \gamma^2 & \dots \\ \vdots & \vdots & \vdots & \ddots \\ \alpha^n & \beta^n & \gamma^n & \dots \end{bmatrix}^{-1} \begin{bmatrix} A_1^1 \\ A_1^2 \\ \vdots \\ A_1^n \end{bmatrix}$$

where the overlay OV subscripts refer to the overlay pair and correspond with the previous examples, the intensity asymmetry $A_1$ is an intensity asymmetry measurement of the sub-target having no positional bias in any layer, and the superscripts for $A_1$, $\alpha$, $\beta$ etc. each relate to a different measurement with a different wavelength and/or polarization. As before, measurement calculation terms $\alpha$, $\beta$, $\gamma$, etc. describe values calculated from a particular combination of intensity asymmetry measurements from the sub-targets. These measurement calculation terms $\alpha$, $\beta$, $\gamma$, etc. can be determined in each case once the substitutions for the lower overlay pairs have been made in the generalized basic intensity asymmetry equation:

$$A = K_{21}X_{21} + K_{31}X_{31} + K_{32}X_{32} + K_{41}X_{41}K_{42}X_{42}K_{43}X_{43} \dots K_{(n+1)n}X_{(n+1)n}$$

such that the equation is described only in terms of the n overlay pairs which include the top layer. Each coefficient of each of these n overlay pairs will then be one of the $\alpha$, $\beta$, $\gamma$, etc. terms. For example, when n=3, then:

$$\alpha = K_{31} + K_{21} + K_{41}, \beta = K_{32} - K_{21} + K_{42}, \gamma = K_{43} - K_{32} - K_{31}$$

Each of these coefficients can then be rearranged (based on knowledge of the actual target design) to be described in terms of intensity asymmetry measurements and positional biases in a similar manner as described with the n=2 example given above. As such, the actual form of each of these measurement calculation terms will vary, not only on the number of overlay pairs, but also on the actual target design. How each term is calculated in each specific case will be readily apparent to the skilled person from the above description.

Figure 7:
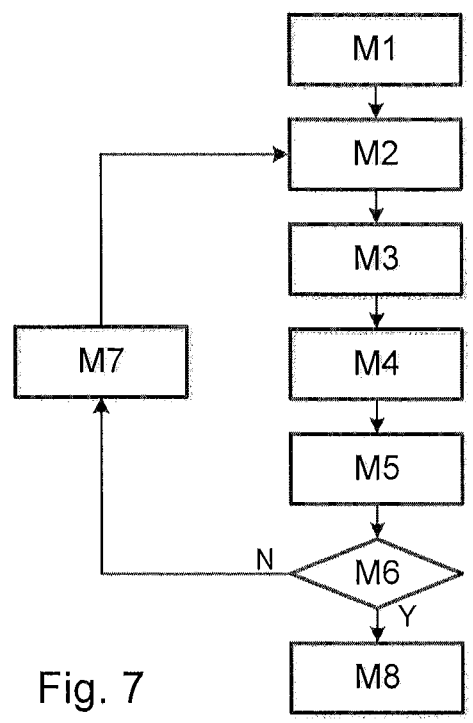
FIG. 7 is a flowchart showing the steps of an overlay measurement method using the apparatus of FIG. 3 according to embodiments of the invention.

FIG. 7 illustrates how overlay between the two layers of two or more overlay pairs may be determined. At step M1, the substrate, for example a semiconductor wafer, is processed through a lithographic cell such as depicted in FIG. 2 one or more times, to create a structure including a target such as that shown in FIG. 6. At M2, using for example the metrology apparatus of FIG. 3, a first image of each sub-target is obtained using one of the first order diffracted beams (say −1) of a first wavelength/polarization. At step M3, whether by, for example, changing the illumination mode, or changing the imaging mode, or by rotating substrate W by 180° in the field of view of the metrology apparatus, a second image of each sub-target using the other first order (+1) diffracted beam (having the same wavelength/polarization) is obtained.

Note that, by including only half of the first order diffracted radiation in each image, the 'images' referred to here are not conventional dark field microscopy images. The individual sub-target features are not resolved. Each sub-target will be represented simply by an area of a certain intensity level. In step M4, a region of interest (ROI) is identified within the image of each component sub-target, from which intensity levels will be measured.

Having identified the region of interest for each respective individual sub-target and measured its intensity, the intensity asymmetry of each sub-target can then be determined (step M5).

At step M6 it is determined whether n measurements have been made. If not, the wavelength and/or polarization of the measurement radiation is varied (step M7) and steps M2 to M5 are repeated. In an alternative embodiment, where the metrology device has the capability, the n measurements with different wavelengths/polarizations may be performed simultaneously. This is possible where the metrology device uses broadband or multiple band measurement radiation to measure the target, and is able to process measurement data relating to the different wavelengths/polarizations separately. Such metrology devices have been described in the art and will be known to the skilled person, and therefore will not be described further.

When n measurements have been made, each using a different measurement recipe (e.g., different wavelength/polarization), the measurements together with knowledge of the target design and positional biases are used (step M8) to calculate the overlay for one or more of the overlay pairs (overlay between each layer pair) comprised within the measured target. This step may be performed using the methods and equations described above. The overlay can then be used for various purposes including control, design, etc. of various processes and/or apparatuses. For example, the overlay can be fed back for improvement of the lithographic process, used to improve the measurement and calculation process of FIG. 7 itself, used to improve the design of the target T, etc.

It is proposed that the above methodology also be used to mitigate the effect of dummy structures by replacing the dummy structures with actual overlay gratings forming part of a target such as that illustrated in FIG. 6. This has an advantage of meeting process requirements with the benefit of yielding additional overlay information. If the additional overlay information is not of interest, a dummy structure (grating) may still be used. By way of a specific example, it may be that only overlay pair $OV_{32}$, is of interest, but not overlay pair $OV_{31}$ (n=2 example); however a dummy structure may be required in layer L1. To minimize its effect on the measurement of overlay pair $OV_{32}$, the dummy structure may comprise a sub-multiple pitch (e.g., 100 nm) compared to the main pitch (i.e. 600 nm). Such a target may otherwise have a structure similar to that of the target 300 of FIG. 6 with the dummy structure replacing the gratings in layer L1. In such an example, the measured a will be relatively small, but may still result in a measurement error in measuring overlay pair $OV_{32}$. Therefore the same methodology and equations as described above (with two measurements using different recipes) can be used to remove the effect of the dummy structure.

A main advantage of the method described is that it enables determination of two or more overlay pairs in one measurement (assuming that multiple band radiation is used). Another advantage is that patterning device/substrate area is saved compared to using individual targets. For example, the target of FIG. 6 is 25% smaller than two individual targets of the form shown in FIG. 4. This area saving increases as the number of overlay pairs n increases compared to measuring the same number of overlay pairs using individual targets. Additionally, when measuring overlay using individual (FIG. 4) targets, layers intervening the overlay layer pair should be opened or protected in order to prevent signal crosstalk. However, the methods disclosed herein mean that, instead of keeping such intervening layers open or protected, additional gratings can be inserted. This has advantages of enabling measurement of overlay of the intervening layer in the same measurement and being more process friendly.

Although specific reference may have been made above to the use of embodiments in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules and that are differently organized than depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments according to the invention are described in below numbered clauses:

1. A method of measuring n values of a parameter of interest relating to a process for forming one or more structures on a substrate, where n>1, the method comprising:

performing n measurements on each of n+1 targets, each measurement performed with measurement radiation comprising a different wavelength and/or polarization combination, each target comprising n+1 layers, each layer comprising a periodic structure, and the targets comprising at least n biased targets having at least one biased periodic structure formed with an intentional positional bias relative to the other layers, the biased periodic structure being in at least a different one of the layers per biased target; and determining the n values for the parameter of interest from the n measurements of n+1 targets, each of the n values relating to the parameter of interest for a different pair of the layers.

2. The method of clause 1, wherein each of the measurements is an intensity asymmetry measurement comprising comparing at least one pair of corresponding higher diffraction orders of the measurement radiation subsequent to diffraction from the structure.

3. The method of clause 1 or clause 2, wherein the parameter of interest is overlay, the n overlay values each describing an unintentional positional offset between structures formed in a different pair of the layers.

4. The method of clause 3, wherein the n+1 targets further comprise a non-biased target having no intentional positional bias between the periodic structures in any of its layers.

5. The method of clause 4, wherein the determining comprises determining a combination of a one dimensional matrix and the inverse of a two dimensional square matrix; wherein:

the two dimensional square matrix comprises elements each relating to the measurements performed with a different one of the wavelength and/or polarization combinations in a first dimension, and to a different measurement calculation term in a second dimension; and the one dimensional matrix relates to measurements of the non-biased target performed with a different one of the wavelength and/or polarization combinations in the first dimension.

6. The method of clause 5, wherein each different measurement calculation term relates to the measurements from a different combination of the targets.

7. The method of clause 5 or clause 6, wherein the different measurement calculation terms are derived from the intensity asymmetry response of a target recited in terms of the n overlay values between the top layer and each of the other layers, and knowledge of the target structure.

8. The method of clause 7, wherein each different measurement calculation term is derived from a different coefficient of the n overlay values between the top layer and each of the other layers.

9. The method of any of clauses 3 to 8, comprising determining the n overlay values in two orthogonal directions, wherein the targets comprise two sets of the n+1 targets, one set for each of the two orthogonal directions.

10. The method of any of clauses 3 to 9, wherein at least one of the periodic structures of at least one of the targets comprises a dummy structure having a configuration operable to minimize its effect on measurement of an overlay value of interest, wherein an overlay value relating to the dummy structure is determined and used to correct the overlay value of interest.

11. The method of any preceding clause, wherein the n biased targets each comprise the biased periodic structure in a different one of their upper layers.

12. The method of any preceding clause, wherein each of the targets is a sub-target forming part of a composite target.

13. The method of any preceding clause, further comprising determining a correction for the lithographic process based on the determined values for the parameter of interest.

14. The method of clause 13, further comprising performing a subsequent lithographic process using the correction.

15. A substrate comprising n+1 targets, each target comprising n+1 layers, each layer comprising a periodic structure, the targets comprising at least n biased targets having at least one biased periodic structure formed with an intentional positional bias relative to the other layers, the biased periodic structure being in at least a different one of the layers per biased target.

16. The substrate of clause 15, wherein the n+1 targets further comprise a non-biased target having no intentional positional bias between the periodic structures in any of its layers.

17. The substrate of clause 15 or clause 16, wherein the n biased targets each comprise the biased periodic structure in a different one of their upper layers.

18. The substrate of any of clauses 15 to 17, wherein each of the targets is a sub-target forming part of a composite target.

19. The substrate of any of clauses 15 to 18, wherein the targets comprise two sets of the n+1 targets, one set for each of two orthogonal directions.

20. A lithographic apparatus being operable to manufacture the substrate of any of clauses 15 to 19, by being operable to form the targets on the substrate using a lithographic process.

21. A metrology device operable to perform the method of any of clauses 1 to 14.

22. A lithographic system comprising the lithographic apparatus of clause 20 and the metrology device of clause 21.

23. A set of patterning devices, each having a pattern for patterning a beam of radiation to form a structure on a substrate in a lithographic process, and operable to produce the substrate of clauses 15 to 19, each patterning device comprising a pattern for forming a different layer of the targets.

24. A computer program comprising program instructions operable to perform the method of any of clauses 1 to 14 when run on a suitable apparatus.

25. A non-transient computer program carrier comprising the computer program of clause 24.

The breadth and scope of the present invention should not be limited by any of the above-described exemplary embodiments, but should be defined only in accordance with the following claims and their equivalents.

The invention claimed is:

1. A method of measuring n values of a parameter of interest relating to a process for forming one or more structures on a substrate, where n>1, the method comprising:

performing n measurements on each of n+1 targets, each measurement performed with measurement radiation comprising a different wavelength and/or polarization combination, each target comprising n+1 layers, each layer comprising a periodic structure, and the targets comprising at least n biased targets having at least one biased periodic structure formed with an intentional positional bias relative to the other layers, the biased periodic structure being in at least a different one of the layers per biased target, wherein each of the measurements is an intensity asymmetry measurement comprising comparing at least one pair of corresponding higher diffraction orders of the measurement radiation subsequent to diffraction from the structure; and determining the n values for the parameter of interest from the n measurements of n+1 targets, each of the n values relating to the parameter of interest for a different pair of the layers.

2. The method of claim 1, wherein the parameter of interest is overlay, the n overlay values each describing an unintentional positional offset between structures formed in a different pair of the layers.

3. The method of claim 2, wherein the n+1 targets further comprise a non-biased target having no intentional positional bias between the periodic structures in any of its layers.

4. The method of claim 3, wherein the determining comprises determining a combination of a one dimensional matrix and the inverse of a two dimensional square matrix; wherein:

the two dimensional square matrix comprises elements each relating to the measurements performed with a different one of the wavelength and/or polarization combinations in a first dimension, and to a different measurement calculation term in a second dimension; and the one dimensional matrix relates to measurements of the non-biased target performed with a different one of the wavelength and/or polarization combinations in the first dimension.

5. The method of claim 2, comprising determining the n overlay values in two orthogonal directions, wherein the targets comprise two sets of the n+1 targets, one set for each of the two orthogonal directions.

6. The method of claim 2, wherein at least one of the periodic structures of at least one of the targets comprises a dummy structure having a configuration operable to minimize its effect on measurement of an overlay value of interest, wherein an overlay value relating to the dummy structure is determined and used to correct the overlay value of interest.

7. The method of claim 1, wherein the n biased targets each comprise the biased periodic structure in a different one of their upper layers.

8. The method of claim 1, wherein each of the targets is a sub-target forming part of a composite target.

9. The method of claim 1, further comprising determining a correction for the lithographic process based on the determined values for the parameter of interest.

10. A substrate comprising n+1 targets, where n>1, each target comprising n+1 layers, each layer comprising a periodic structure, the targets comprising at least n biased targets having at least one biased periodic structure formed with an intentional positional bias relative to the other layers, the biased periodic structure being in at least a different one of the layers per biased target and comprising a non-biased target having no intentional positional bias between the periodic structures in any of its layers.

11. The substrate of claim 10, wherein the n biased targets each comprise the biased periodic structure in a different one of their upper layers.

12. The substrate of claim 10, wherein each of the targets is a sub-target forming part of a composite target.

13. The substrate of claim 10, wherein the targets comprise two sets of the n+1 targets, one set for each of two orthogonal directions.

14. A lithographic apparatus being operable to manufacture the substrate of claim 10, by being operable to form the targets on the substrate using a lithographic process.

15. A set of patterning devices, each having a pattern for patterning a beam of radiation to form a structure on a substrate in a lithographic process, and operable to produce the substrate of claim 10, each patterning device comprising a pattern for forming a different layer of the targets.

16. A non-transitory computer program product comprising program instructions therein, the instructions, upon execution by a computer system, configured to cause the computer system to at least:

obtain n measurement results, where n>1, of each of n+1 targets, each of the measurement results obtained from measurement performed with measurement radiation comprising a different wavelength and/or polarization combination, each target comprising n+1 layers, each layer comprising a periodic structure, and the targets comprising at least n biased targets having at least one biased periodic structure formed with an intentional positional bias relative to the other layers, the biased periodic structure being in at least a different one of the layers per biased target, wherein each measurement results is from an intensity asymmetry measurement comprising comparison of at least one pair of corresponding higher diffraction orders of the measurement radiation subsequent to diffraction from the structure; and determine n values for a parameter of interest relating to a process for forming one or more structures on a substrate from the n measurements of n+1 targets, each of the n values relating to the parameter of interest for a different pair of the layers.

17. The computer program product of claim 16, wherein the n+1 targets further comprise a non-biased target having no intentional positional bias between the periodic structures in any of its layers.

18. The computer program product of claim 17, wherein the determination of the n values for the parameter of interest comprises determination of a combination of a one dimensional matrix and the inverse of a two dimensional square matrix; wherein:

the two dimensional square matrix comprises elements each relating to the measurements performed with a different one of the wavelength and/or polarization combinations in a first dimension, and to a different measurement calculation term in a second dimension; and the one dimensional matrix relates to measurements of the non-biased target performed with a different one of the wavelength and/or polarization combinations in the first dimension.

19. The computer program product of claim 16, wherein the determination of the n values for the parameter of interest comprises determination of the n overlay values in two orthogonal directions, wherein the targets comprise two sets of the n+1 targets, one set for each of the two orthogonal directions.

20. The computer program product of claim 16, wherein at least one of the periodic structures of at least one of the targets comprises a dummy structure having a configuration operable to minimize its effect on measurement of an overlay value as the parameter of interest, wherein an overlay value relating to the dummy structure is determined and used to correct the overlay value as the parameter of interest.

21. A metrology device comprising the non-transitory computer product of claim 16.

22. A lithographic system comprising a lithographic apparatus and the metrology device of claim 21.

* * * * *